(12) United States Patent
Kato

(10) Patent No.: US 8,148,636 B2
(45) Date of Patent: Apr. 3, 2012

(54) ELECTRIC DEVICE

(75) Inventor: Kenichi Kato, Tokyo (JP)

(73) Assignee: Nohmi Bosai Ltd., Tokyo (JP)

( * ) Notice: Subject to any disclaimer, the term of this patent is extended or adjusted under 35 U.S.C. 154(b) by 231 days.

(21) Appl. No.: 12/731,502

(22) Filed: Mar. 25, 2010

(65) Prior Publication Data

US 2010/0243290 A1 Sep. 30, 2010

(30) Foreign Application Priority Data

Mar. 31, 2009 (JP) .................................. 2009-087851

(51) Int. Cl.
 *H05K 5/00* (2006.01)

(52) U.S. Cl. ............. 174/50; 174/58; 438/535; 248/906

(58) Field of Classification Search ............... 174/50, 174/17 R, 58, 66; 248/906; 439/535; 220/4.02; 33/528
See application file for complete search history.

(56) References Cited

U.S. PATENT DOCUMENTS

| 7,179,990 B2* | 2/2007 | Kanazawa | 174/50 |
| 7,956,284 B2* | 6/2011 | Bravo et al. | 174/50 |
| 7,960,649 B2* | 6/2011 | Giefers | 174/50 |

FOREIGN PATENT DOCUMENTS

JP 2002 281489 9/2002

* cited by examiner

*Primary Examiner* — Dhirubhai R Patel
(74) *Attorney, Agent, or Firm* — Frost Brown Todd LLC

(57) ABSTRACT

A cover (5) includes a first bent portion (5b) and a second bent portion (5c) which are provided in series to be continuous with a lid portion (5a). A casing (2) includes a hole (8) through which the cover is allowed to be inserted/removed and movably inserted into/removed from the casing, and includes a cover locking portion (9) to which the cover is locked in a substantially upright posture while covering an opening portion (4) with the lid portion. The cover can pivot in a fore-and-aft direction at a corner portion (5d) on an inner side of the first bent portion with an inner edge portion (8c) at an intersection between an upper inner wall surface (8a) of the hole and an inner wall surface (3a) of a front wall as a fulcrum. The cover can be displaced between the substantially upright posture and a substantially laid posture.

12 Claims, 8 Drawing Sheets

ELECTRIC DEVICE

BACKGROUND OF THE INVENTION

1. Field of the Invention

The present invention relates to an electric device including a cover which can open and close an opening formed in a casing.

2. Description of the Related Art

An electric device includes an opening which is formed for various purposes in a casing forming an external appearance of the electric device. There is known an electric device including a cover for covering the opening of the casing when the opening is not used.

For example, in a video doorphone described in JP 2002-281489 A, a unit housing part for housing a video recording unit is provided in a casing. The video doorphone includes a cover that is fitted to the unit housing part to cover an opening of the unit housing part when the video recording unit is not accommodated therein and hence the video doorphone is not used for video recording.

Like the cover described in JP 2002-281489 A, a cover of a conventional electric device, which is used when the opening of the casing is not used, is generally opened and closed through attachment and detachment. When the opening is used, such cover is separated from the casing, and hence the cover is sometimes damaged or lost.

SUMMARY OF THE INVENTION

In view of the above-mentioned problem, an object of the present invention is therefore to provide an electric device including a cover which can open and close an opening formed in a casing, can be easily attached to/detached from the casing, and which can be received in the casing when opening the opening.

According to the present invention, an electric device includes:
 a casing including an opening portion formed in a peripheral wall thereof; and
 a cover including a lid portion for opening and closing the opening portion, wherein:
  the cover further includes a first bent portion and a second bent portion which are provided in series to be continuous with the lid portion;
  the casing includes:
   a hole allowing the cover to be inserted/removed into/from the casing therethrough and to be movable in its insertion/removal direction, the hole being provided in a vicinity of the opening portion; and
   a cover locking portion to which the cover is locked in a substantially upright posture while covering the opening portion with the lid portion thereof, the cover locking portion being provided around the opening portion; and
  the cover is pivotable in a fore-and-aft direction at a corner portion on an inner side of the first bent portion of the cover with an inner edge portion at an intersection between an upper inner wall surface of the hole and an inner wall surface of a front wall as a fulcrum, and the cover is allowed to be displaced between the substantially upright posture and a substantially laid posture.

Further, according to the present invention, in the electric device, the first bent portion and the second bent portion are respectively formed into substantially L-shapes, and the first bent portion and the second bent portion are continuously formed into a step shape.

Further, according to the present invention, in the electric device, a corner portion on an inner side of the second bent portion is engaged with an inner edge portion located at an intersection between a lower inner wall surface of the hole and the inner wall surface of the front wall.

Further, according to the present invention, in the electric device, the cover locking portion includes a recess formed to allow an outer surface of the cover to be flush with an outer surface of the peripheral wall of the casing when the cover takes the substantially upright posture.

Further, according to the present invention, in the electric device, the cover is made of metal, and the cover locking portion includes a magnet to which the cover is attracted so that the cover is kept in the substantially upright posture.

Further, according to the present invention, in the electric device, the casing includes a cover receiving portion in which the cover is received in the substantially laid posture, the cover receiving portion being provided on an inner side of the hole.

Further, according to the present invention, in the electric device, the cover receiving portion includes a biasing member for biasing movement of the cover to an outside of the casing.

In the present invention, the cover is allowed to be inserted/removed through the hole, that is, to be attached to/detached from the casing. Further, the cover is pivotable in a fore-and-aft direction at the corner portion on the inner side of the first bent portion of the cover with the inner edge portion at the intersection between the upper inner wall surface of the hole and the inner wall surface of the front wall as the fulcrum. The cover is displaced between the substantially upright posture and the substantially laid posture, and can open and close the opening portion. Further, in the substantially laid posture, that is, in a state of opening the opening portion, the cover can be received in the cover receiving portion of the casing. In addition, the corner portion on the inner side of the second bent portion is engaged with the inner edge portion located at the intersection between the lower inner wall surface of the hole and the front-wall inner wall surface, and hence it is possible to prevent the cover from rattling in an up-down direction in the cover receiving portion.

Therefore, according to the present invention, it is possible to obtain an electric device in which a cover for opening and closing an opening portion can be attached to/detached from a casing, and in which the cover can be received in the casing when opening the opening portion.

BRIEF DESCRIPTION OF THE DRAWINGS

In the accompanying drawings:

FIGS. 3A to 3C are views of the fire detector in a state illustrated in FIG. 1, in which FIG. 3A is a partially-omitted front view of the fire detector, FIG. 3B is a sectional view taken along the line A-A of FIG. 3A, and FIG. 3C is an enlarged view of the part B of FIG. 3B;

FIGS. 4A to 4C are views of the fire detector in a state illustrated in FIG. 2, in which FIG. 4A is a partially-omitted front view of the fire detector, FIG. 4B is a sectional view taken along the line A-A of FIG. 4A, and FIG. 4C is an enlarged view of the part B of FIG. 4B;

FIGS. 7A to 7C are views of the fire detector in a state in which the cover is pulled to an outside of the casing and is in the course of pivoting between the substantially laid posture and the substantially upright posture, in which FIG. 7A is a partially-omitted front view of the fire detector, FIG. 7B is a sectional view taken along the line A-A of FIG. 7A, and FIG. 7C is an enlarged view of the part B of FIG. 7B;

FIGS. 8A to 8C are views of a fire detector according to a second embodiment, which correspond to FIGS. 3A to 3C, and in which FIG. 8A is a partially-omitted front view of the fire detector, FIG. 8B is a sectional view taken along the line C-C of FIG. 8A, and FIG. 8C is an enlarged view of the part D of FIG. 8B;

FIGS. 9A to 9C are views of the fire detector according to the second embodiment, which correspond to FIGS. 4A to 4C, and in which FIG. 9A is a partially-omitted front view of the fire detector, FIG. 9B is a sectional view taken along the line A-A of FIG. 9A, and FIG. 9C is an enlarged view of the part B of FIG. 9B.

DETAILED DESCRIPTION OF THE PREFERRED EMBODIMENTS

Figure 1:
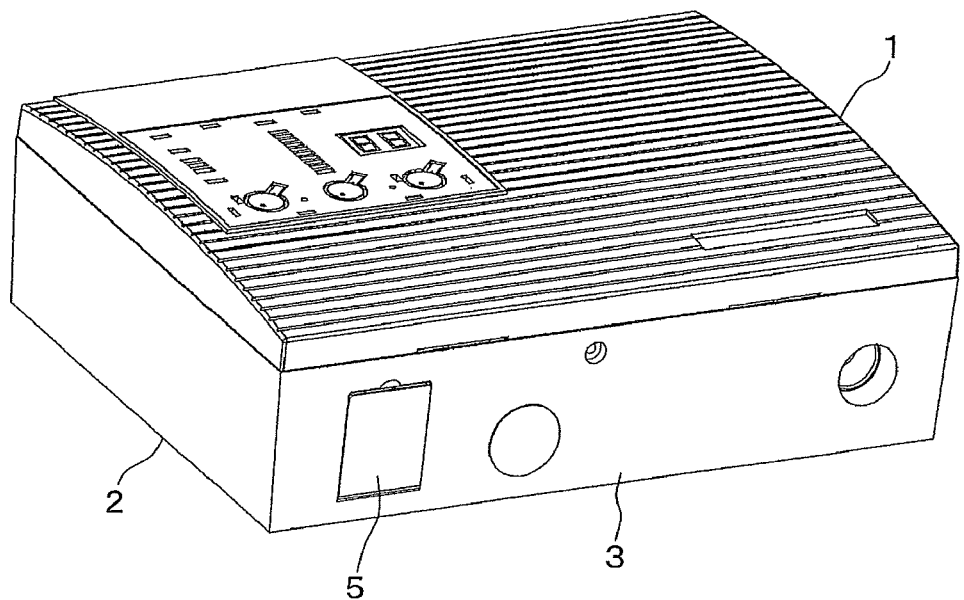
FIG. 1 is a perspective view of a fire detector as an example of an electric device according to a first embodiment of the present invention, which illustrates a state in which a cover closes an opening portion while taking a substantially upright posture.

Description is made of cases in which embodiments of the present invention are applied to a smoke detector by way of example.

First, a first embodiment is described with reference to FIGS. 1 to 7.

A smoke detector 1 exemplified as an electric device has a box-like appearance with a casing 2. An opening portion 4 is formed in a front wall 3 of peripheral walls of the casing 2. The casing 2 is provided with a cover 5 including a lid portion 5a for opening and closing the opening portion 4.

Note that, the smoke detector 1 optically detects the smoke and the like floating in the air. Although detailed description thereof is omitted, the smoke detector 1 includes, in the casing 2, a smoke detecting unit for optically detecting the smoke, and a fan and an air duct for causing the sampled air to flow into a smoke detecting portion provided in the smoke detecting unit.

Figure 2:
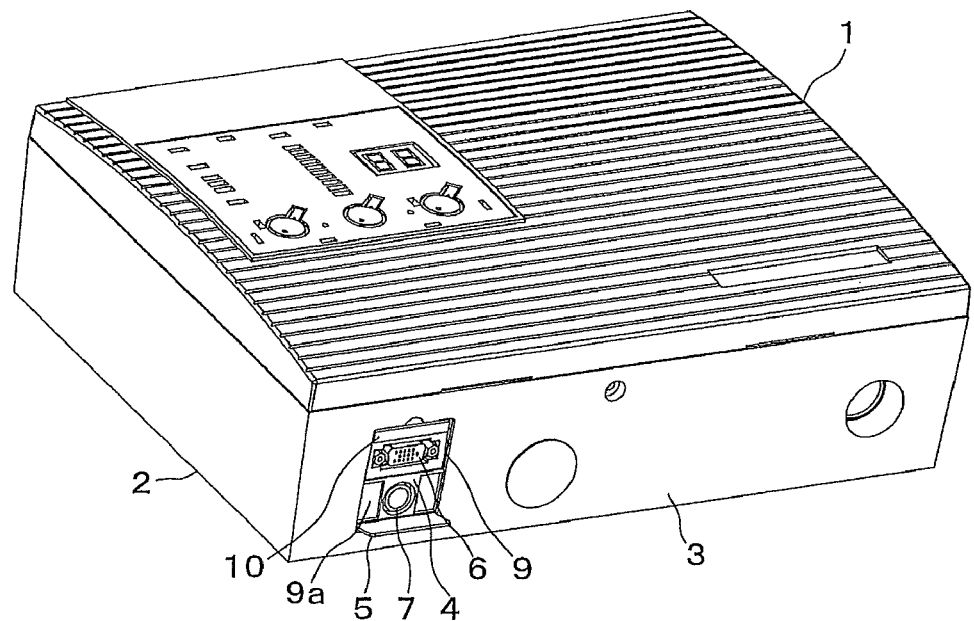
FIG. 2 is a perspective view of the fire detector, which illustrates a state in which the cover opens the opening portion and is received in an inside of a casing while taking a substantially laid posture.
Figure 3:
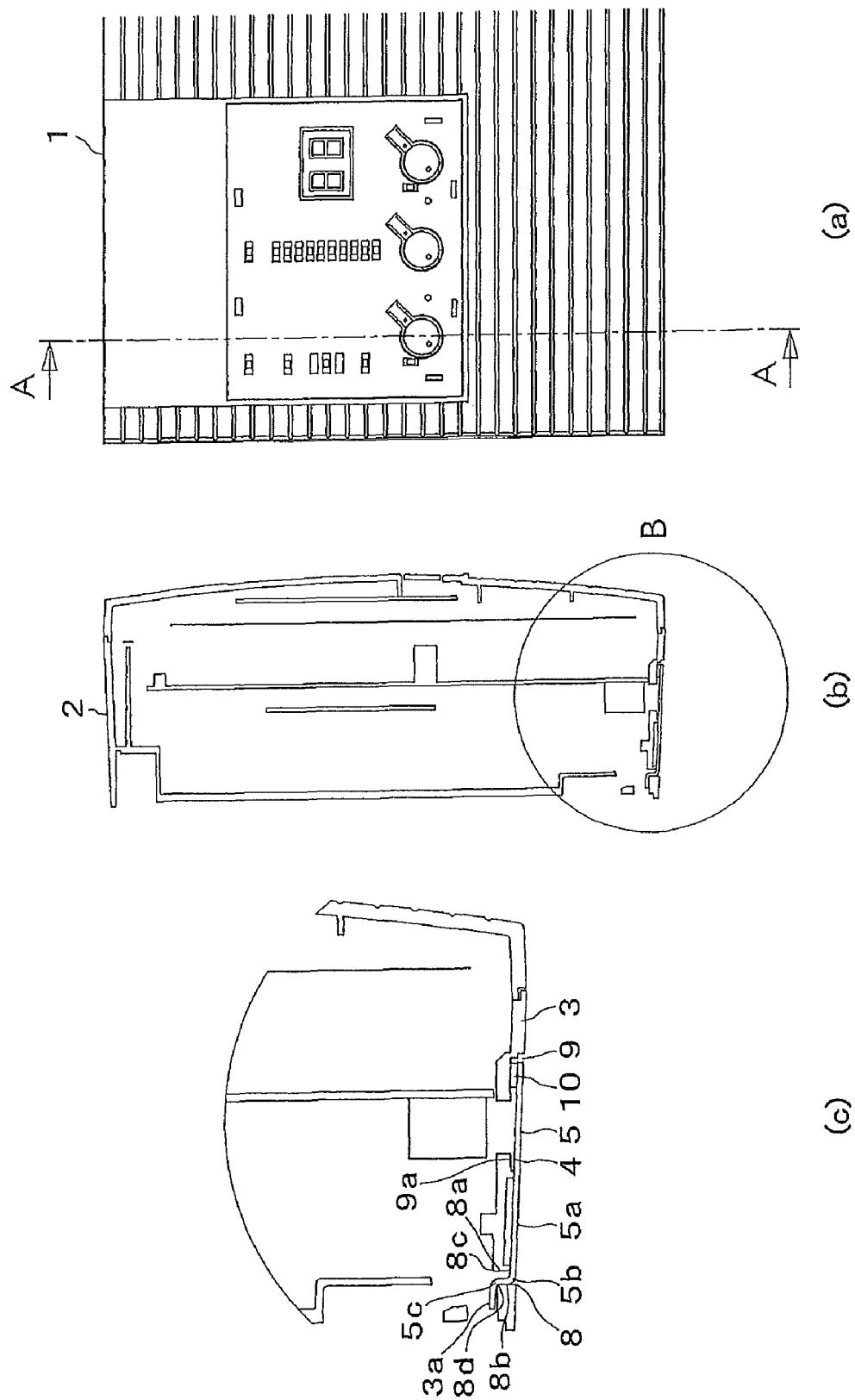
Figure 4:
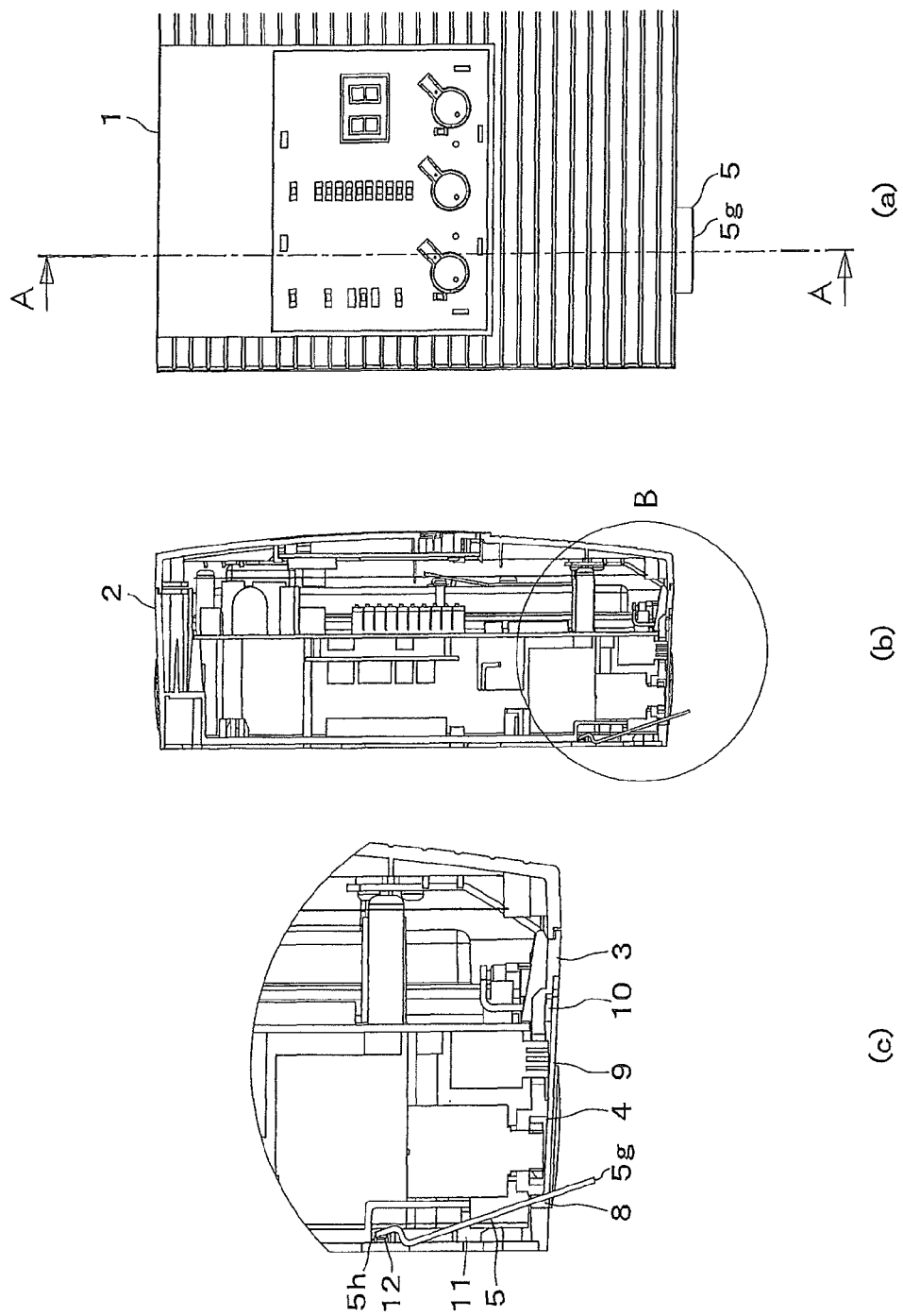
Figure 5:
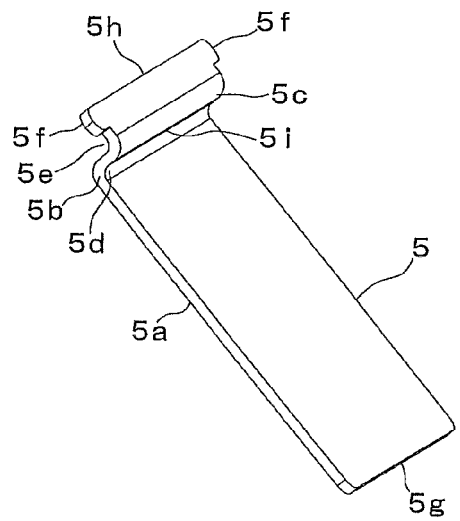
FIG. 5 is a perspective view of the cover of the fire detector.
Figure 6:
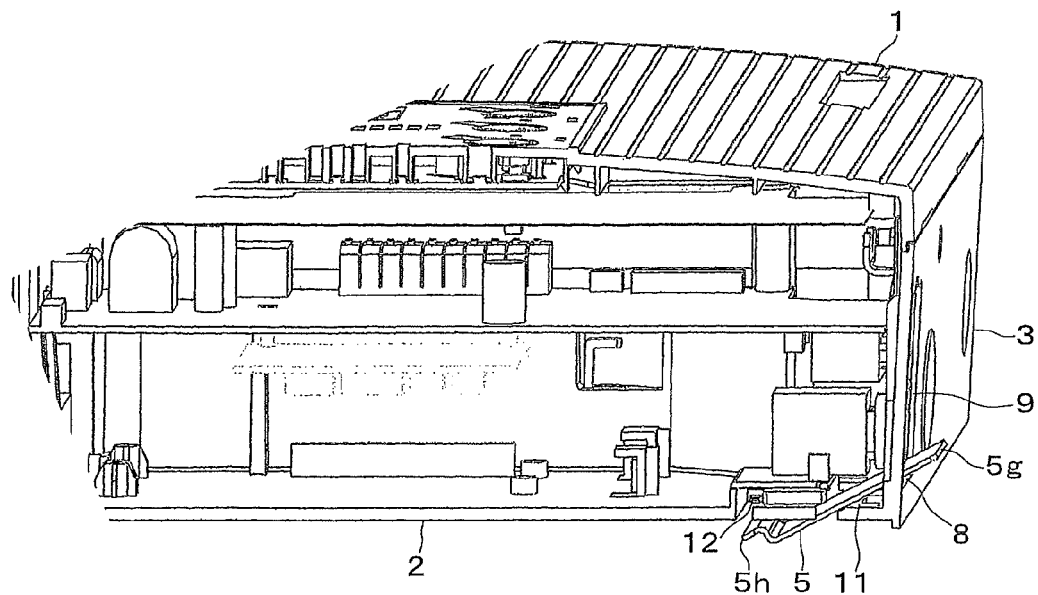
FIG. 6 is a perspective vertical sectional view of a main part of the fire detector, which illustrates a state in which the cover is attached from a back surface of the casing and not locked to a hook.
Figure 7:
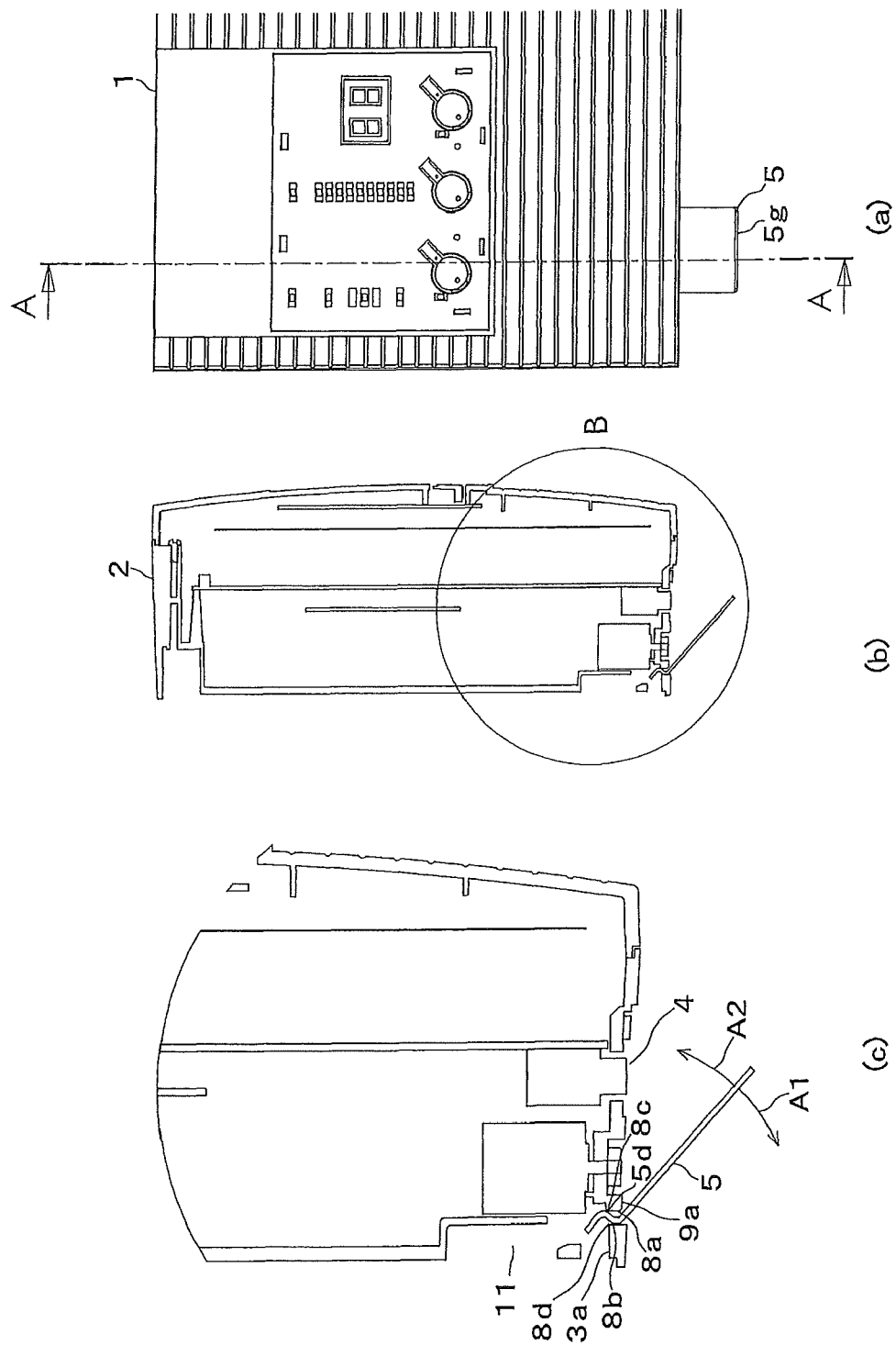

In this example, the opening portion 4 is provided with, for example, a terminal 6 used for external communication and a jack 7 used for telephone. The terminal 6 and the jack 7 are covered with the lid portion 5a of the cover 5 when the lid portion 5a of the cover 5 closes the opening portion 4 as illustrated in FIG. 1, and are exposed to the outside when the lid portion 5a of the cover 5 opens the opening portion 4 as illustrated in FIG. 2.

Below the opening portion 4, there is provided a slit-like hole 8 through which the cover 5 is allowed to be inserted/removed and movably inserted into/removed from the casing 2. Further, around the opening portion 4, there is provided a cover locking portion 9 to which the cover 5 is locked in the substantially upright posture while covering the opening portion 4 with the lid portion 5a thereof. The cover locking portion 9 includes a recess formed to allow an outer surface of the cover 5 to be flush with an outer surface of the front wall 3 when the cover 5 is locked in the substantially upright posture. Further, the cover locking portion 9 includes a magnet 10 provided above the opening portion 4, for attracting the cover 5 due to its magnetic force and keeping the cover 5 locked in the substantially upright posture.

The cover 5 includes a first bent portion 5b, an intermediate portion 5i, and a second bent portion 5c which are provided in series to be continuous with the flat-plate-like lid portion 5a. The first bent portion 5b and the second bent portion 5c are respectively formed into substantially L-shapes, and are continuously formed into a step shape. Further, in the cover 5, substantially L-shaped outer and inner surfaces of each of the first bent portion 5b and the second bent portion 5c are formed into curved surfaces by bending. Note that, the cover 5 is made of metal, and is directly attracted to the magnet 10 provided to the cover locking portion 9 due to the magnetic force. The cover 5 may be formed of a resin molded product, and may be retained by, instead of the magnet 10, locking means respectively provided to the cover 5 and a bottom surface 9a of the recess of the cover locking portion 9.

As illustrated in FIGS. 3A to 3C, in a state in which the lid portion 5a closes the opening portion 4, the cover 5 is inserted through the hole 8, and takes the substantially upright posture while the lid portion 5a is exposed to the outside from the hole 8. In this case, the substantially L-shaped inner surface of the second bent portion 5c of the cover 5 is engaged with a substantially L-shaped surface formed of a lower inner wall surface 8b of the hole 8 and an inner wall surface 3a of the front wall 3 which is perpendicular and continuous to the lower inner wall surface 8b. With this structure, the cover 5 takes the substantially upright posture. Note that, flange portions 5f protruding to both sides of the cover 5 are provided to a flat-plate portion continuous with the second bent portion 5c on a proximal end 5h side of the cover 5. The flange portions 5f can prevent the cover 5 from slipping off from the hole 8 to the outside.

In addition, specifically, as illustrated in FIGS. 7A to 7C, the cover can pivot at a corner portion 5d on an inner side of the substantially L-shaped first bent portion in an arrow A1 direction and an arrow A2 direction, i.e., in a fore-and-aft direction with an inner edge portion 8c at an intersection between an upper inner wall surface 8a of the hole 8 and the inner wall surface 3a of the front wall as a fulcrum. Thus, it is possible to displace the cover 5 between the substantially upright posture of closing the opening portion 4 and the substantially laid posture of opening the opening portion 4, and it is possible to open and close the opening portion 4. Further, a corner portion 5e on an inner side of the substantially L-shaped second bent portion is engaged with an inner edge portion 8d located at an intersection between the lower inner wall surface 8b of the hole 8 and the inner wall surface 3a of the front wall, and hence it is possible to prevent the cover 5 from rattling in an up-down direction in a recessed surface of the cover locking portion 9.

A cover receiving portion 11 is provided in the casing 2 on the inner side of the hole 8. The cover 5 is moved into the casing 2 through the hole 8 while taking the substantially laid posture, and is received in the cover receiving portion 11 while taking the substantially laid posture. Note that, the flange portions 5f of the cover 5 are hooked to a pair of hooks 12, and the cover 5 is kept to be received in the cover receiving portion 11. Note that, the cover 5 is received in the cover receiving portion 11 in a state in which a forward end 5g of the lid portion 5a is exposed from the hole 8 to the outside. When the cover 5 closes the opening portion 4, the cover 5 can be easily removed from the casing 2 through pinching the forward end of the cover 5.

As described above, in the smoke detector 1, the cover 5 can be inserted/removed through the hole 8, that is, can be attached to/detached from the casing 2, and the cover pivots in the fore-and-aft direction at the corner portion 5d on the inner side of the first bent portion with the inner edge portion 8c at the intersection between the upper inner wall surface 8a of the hole 8 and the inner wall surface 3a of the front wall as a fulcrum. Further, the cover 5 is displaced between the substantially upright posture and the substantially laid posture, and hence the opening portion 4 can be opened and closed. Further, in the substantially laid posture, that is, in a state of opening the opening portion 4, the cover 5 can be received in the cover receiving portion 11 of the casing 2.

Here, procedures for attaching the cover 5 to the casing 2 are described. First, the lid portion 5a of the cover 5 in the laid posture is inserted through the hole 8 from the inner side thereof. Next, when the corner portion 5d on the inner side of the first bent portion 5b comes into contact with the inner edge portion 8c, after the cover 5 starts to rotate with the corner portion 5d as a fulcrum, the first bent portion 5b can be passed through the hole 8. In accordance with this, the cover 5 starts to be displaced to the substantially upright posture. Moreover, when the cover 5 takes the substantially upright posture, the intermediate portion 5i can be passed through the hole 8, and hence the cover 5 makes substantially parallel movement in this posture. Finally, when the corner portion 5e on the inner side of the second bent portion 5c comes into contact with the inner edge portion 8d of the hole 8 serving as the engaging means, the cover 5 is kept in the substantially upright posture. Note that, in order to detach the cover 5 from the casing 2, operations reverse to the above-mentioned operations may be performed. Each of the corner portions does not mean merely one point, but includes a substantially L-shaped surface around the corner portion. Further, according to the shapes of the inner corner portions 5d and 5e, parts of the corner portions with which the fulcrum (inner edge portion 8c) and the engaging means (inner edge portion 8d) come into contact are changed.

Next, a second embodiment of the present invention is described with reference to FIGS. 8 to 10.

Figure 8:
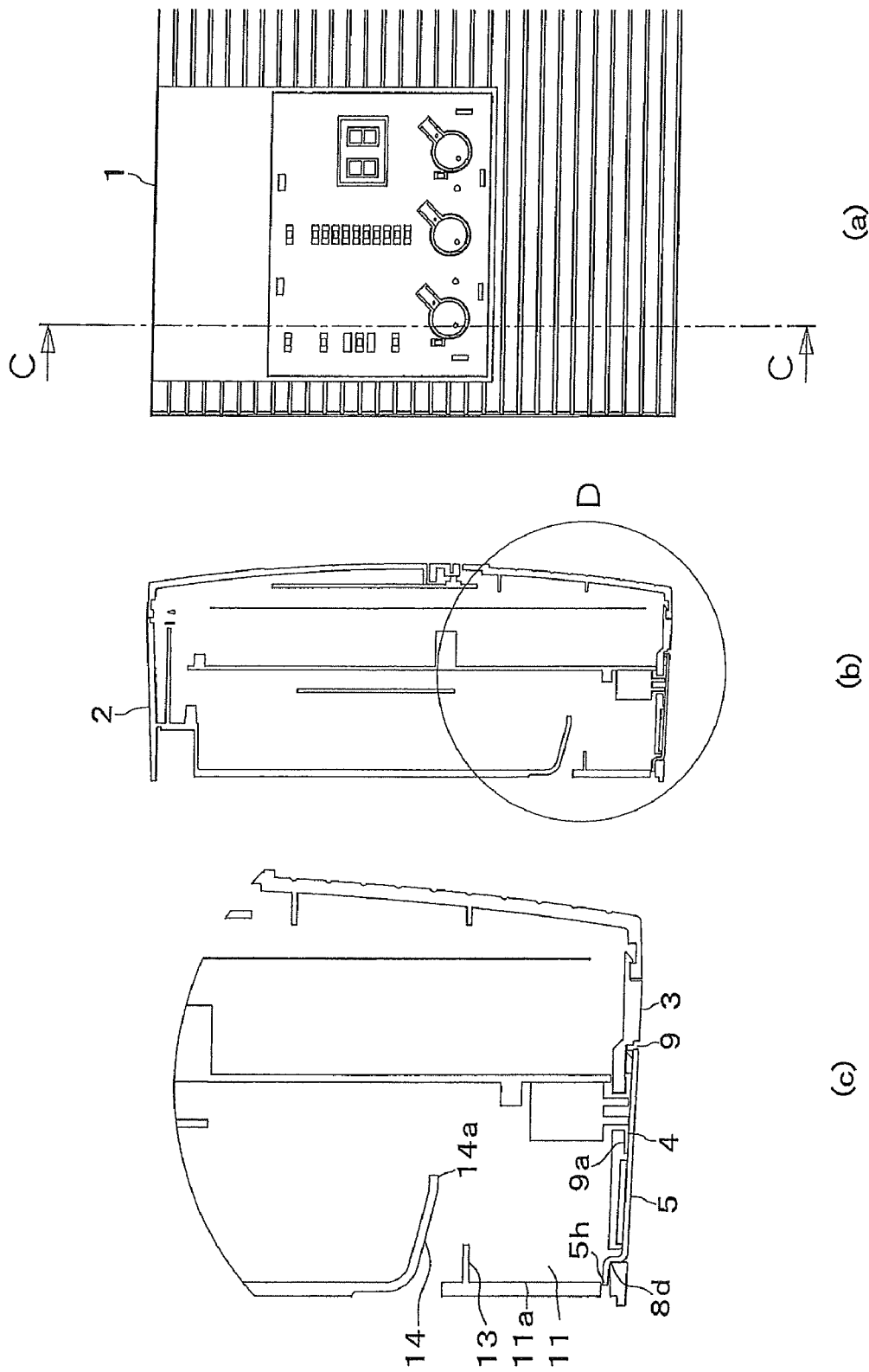
Figure 9:
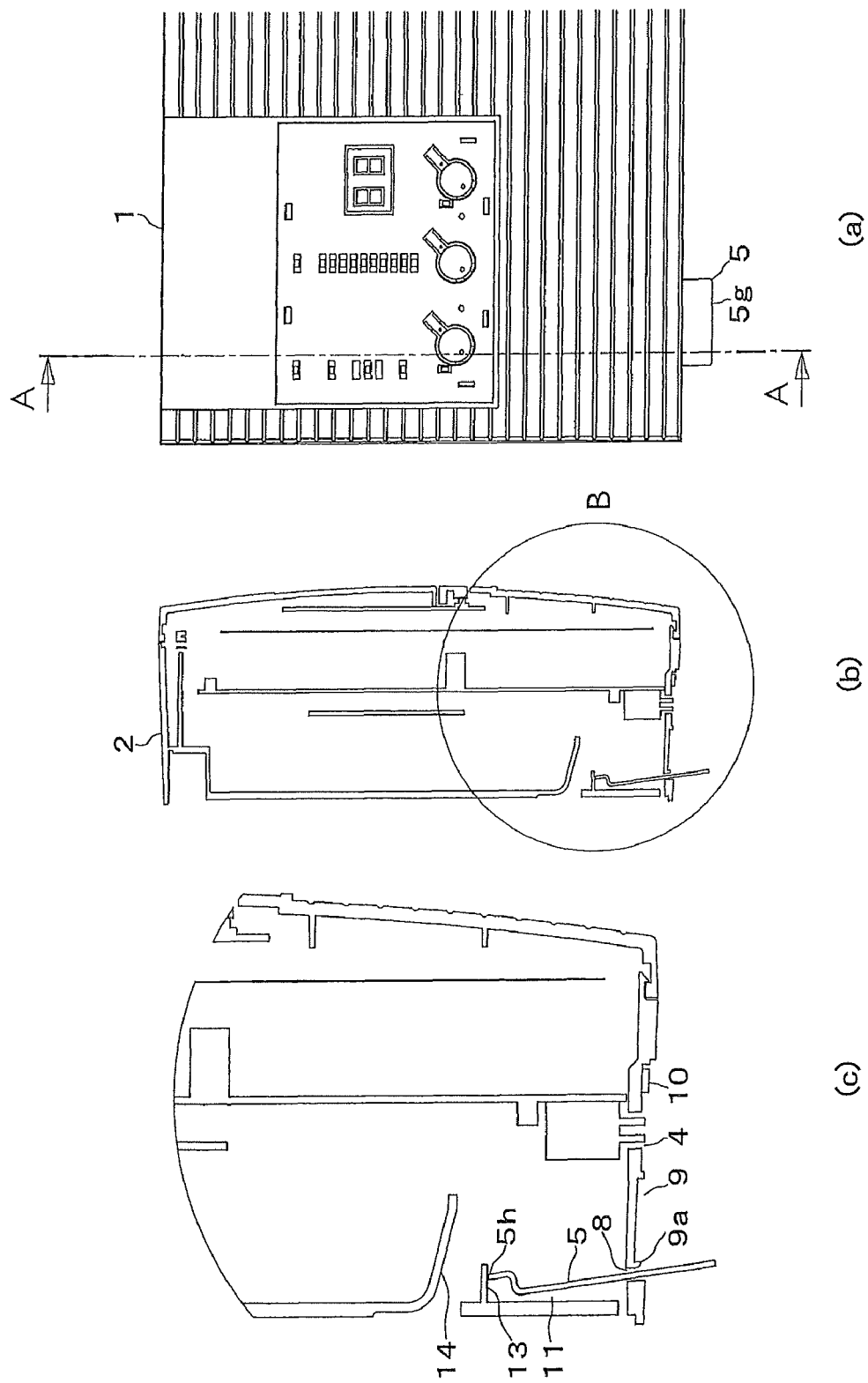
Figure 10:
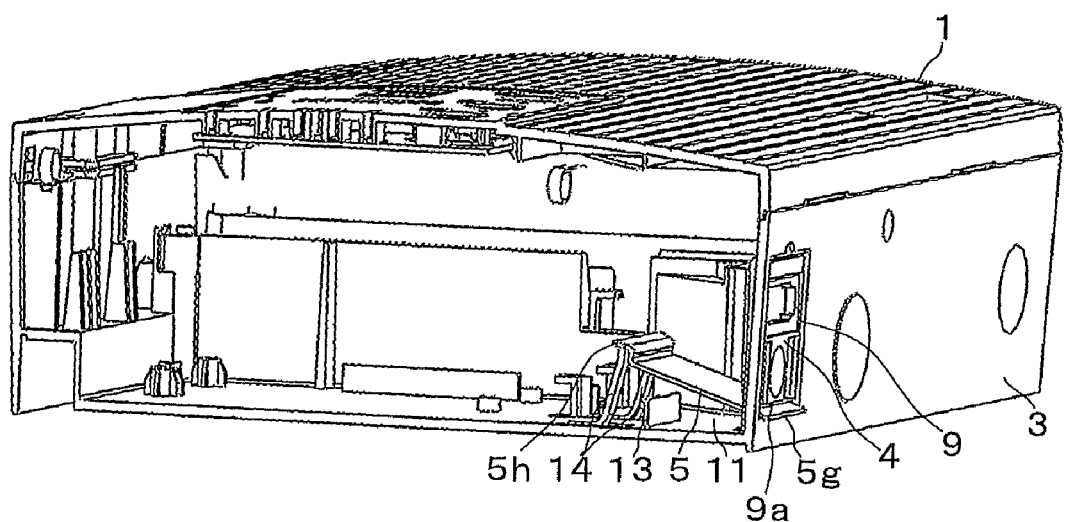
FIG. 10 is a perspective vertical sectional view of a main part of the fire detector according to the second embodiment, which illustrates a state in which the cover is further moved to the inside of the casing from a state illustrated in FIGS. 9A to 9C and is locked to a biasing member.

As illustrated in FIGS. 8 to 10, in the second embodiment, the cover receiving portion 11 further includes a stopper 13 and a guide claw 14. Other configuration is substantially the same as that of the first embodiment.

The stopper 13 is a plate-like member provided upright at a position on a front side of the guide claw 14 so as to be perpendicular to a bottom 11a (bottom plate of the casing 2) of the cover receiving portion 11. The proximal end 5h of the cover 5 inserted through the hole 8 is brought into contact with the stopper 13, and thus movement of the cover 5 into the casing 2 is restricted.

The guide claw 14 is provided obliquely at a position on a back side of the stopper 13 so as to be inclined forward with respect to the bottom 11a (bottom plate of the casing 2) of the cover receiving portion 11. A forward end 14a including two columnar members as free ends is located above the stopper 13 and the hole 8. The guide claw 14 has elasticity, and the forward end 14a has an angle sloping upward in oblique and perpendicular directions. The flat-plate portion of the cover 5 is hooked to the forward end 14a from above. However, when the cover 5 is released from the hooked state, the guide claw 14 can bias the outward movement of the cover 5.

As described above, the second embodiment is the same as the first embodiment other than the configuration having the stopper 13 and the guide claw 14. Also in the smoke detector 1 in the second embodiment, the cover 5 can be inserted/removed through the hole 8, that is, can be attached to/detached from the casing 2, and the cover pivots in the fore-and-aft direction at the corner portion 5d on the inner side of the first bent portion with the inner edge portion 8c at the intersection between the upper inner wall surface 8a of the hole 8 and the inner wall surface 3a of the front wall as a fulcrum. Further, the cover 5 is displaced between the substantially upright posture and the substantially laid posture, and hence the opening portion 4 can be opened and closed. Further, in the substantially laid posture, that is, in a state of opening the opening portion 4, the cover 5 can be received in the cover receiving portion 11 of the casing 2.

What is claimed is:

1. An electric device, comprising:
   a casing comprising an opening portion formed in a peripheral wall thereof; and
   a cover comprising a lid portion for opening and closing the opening portion, wherein:
   the cover further comprises a first bent portion and a second bent portion which are provided in series to be continuous with the lid portion;
   the casing comprises:
      a hole allowing the cover to be inserted/removed into/from the casing therethrough and to be movable in its insertion/removal direction, the hole being provided in a vicinity of the opening portion; and
      a cover locking portion to which the cover is locked in a substantially upright posture while covering the opening portion with the lid portion thereof, the cover locking portion being provided around the opening portion; and
   the cover is pivotable in a fore-and-aft direction at a corner portion on an inner side of the first bent portion of the cover with an inner edge portion at an intersection between an upper inner wall surface of the hole and an inner wall surface of a front wall as a fulcrum, and the cover is allowed to be displaced between the substantially upright posture and a substantially laid posture.

2. An electric device according to claim 1, wherein the first bent portion and the second bent portion are respectively formed into substantially L-shapes, and the first bent portion and the second bent portion are continuously formed into a step shape.

3. An electric device according to claim 2, wherein a corner portion on an inner side of the second bent portion is engaged with an inner edge portion located at an intersection between a lower inner wall surface of the hole and the inner wall surface of the front wall.

4. An electric device according to claim 2, wherein the cover locking portion comprises a recess formed to allow an outer surface of the cover to be flush with an outer surface of the peripheral wall of the casing when the cover takes the substantially upright posture.

5. An electric device according to claim 2, wherein the cover is made of metal, and the cover locking portion comprises a magnet to which the cover is attracted so that the cover is kept in the substantially upright posture.

6. An electric device according to claim 2, wherein the casing comprises a cover receiving portion in which the cover is received in the substantially laid posture, the cover receiving portion being provided on an inner side of the hole.

7. An electric device according to claim 2, wherein the cover receiving portion comprises a biasing member for biasing movement of the cover to an outside of the casing.

8. An electric device according to claim 1, wherein a corner portion on an inner side of the second bent portion is engaged with an inner edge portion located at an intersection between a lower inner wall surface of the hole and the inner wall surface of the front wall.

9. An electric device according to claim 1, wherein the cover locking portion comprises a recess formed to allow an outer surface of the cover to be flush with an outer surface of the peripheral wall of the casing when the cover takes the substantially upright posture.

10. An electric device according to claim 1, wherein the cover is made of metal, and the cover locking portion comprises a magnet to which the cover is attracted so that the cover is kept in the substantially upright posture.

11. An electric device according to claim 1, wherein the casing comprises a cover receiving portion in which the cover is received in the substantially laid posture, the cover receiving portion being provided on an inner side of the hole.

12. An electric device according to claim 1, wherein the cover receiving portion comprises a biasing member for biasing movement of the cover to an outside of the casing.

* * * * *